(12) United States Patent
Fernald

(10) Patent No.: US 6,950,491 B1
(45) Date of Patent: Sep. 27, 2005

(54) CLOCK CIRCUIT WITH FRACTIONAL DIVIDE CIRCUIT

(75) Inventor: Kenneth W. Fernald, Austin, TX (US)

(73) Assignee: Silicon Labs CP, INC, Austin, TX (US)

( * ) Notice: Subject to any disclaimer, the term of this patent is extended or adjusted under 35 U.S.C. 154(b) by 31 days.

(21) Appl. No.: 10/880,916

(22) Filed: Jun. 30, 2004

(51) Int. Cl.[7] .............................................. H03K 21/00
(52) U.S. Cl. ........................................................ 377/48
(58) Field of Search ............................................ 377/48

(56) References Cited

U.S. PATENT DOCUMENTS 6,459,309 B2 * 10/2002 Canard et al. .............. 327/115

* cited by examiner

*Primary Examiner*—Margaret R. Wambach
(74) *Attorney, Agent, or Firm*—Howison & Arnott, L.L.P.

(57) ABSTRACT

A fractional divide circuit for generating a periodic fractional clock is disclosed. A base clock is provided for generating a pre-divide clock at a base clock frequency with a period counter provided for counting cycles of the base clock. A select register stores constants that define parameters for a fractional divide ratio, there being at least four. A positive edge flip flop is provided wherein two of the constants are associated therewith. A negative edge flip flop is provided wherein the other of the two constants are associated therewith. A matching device is operable for setting on the positive edge of the base clock the first flip flop when the first of the two associated constants matches the output of the period counter and clearing the first flip flop when the other of the two associated constants matches the output of the period counter, and setting on the negative edge of the base clock the second flip flop when the first of the two associated constants matches the output of the period counter and clearing the second flip flop when the other of the two associated constants matches the output of the period counter. The outputs of the second and first flip flops are ANDed to provide the fractional clock output.

4 Claims, 7 Drawing Sheets

| SELECT REGISTER | | | COUNTER SEQUENCE | | | | | | | | | | | |
|---|---|---|---|---|---|---|---|---|---|---|---|---|---|---|
| $S_3$ | $S_2$ | $S_1$ | | | | | | | | | | | | |
| 0 | 0 | 0 | ↓ | | | ↓ | | | ↓ | | | ↓ | | |
| 0 | 0 | 1 | | | | | | | | | | | | |
| 0 | 1 | 0 | | | | | | | | | | | | |
| 0 | 1 | 1 | 3 | 2 | 1 | 3 | 2 | 1 | 3 | 2 | 1 | 3 | 2 | 1 |
| 1 | 0 | 0 | 2 | 1 | 2 | 1 | 2 | 1 | 2 | 1 | 2 | 1 | 2 | 1 |
| 1 | 0 | 1 | 5 | 4 | 3 | 2 | 1 | 5 | 4 | 3 | 2 | 1 | 5 | 4 |
| 1 | 1 | 0 | 3 | 2 | 1 | 3 | 2 | 1 | 3 | 2 | 1 | 3 | 2 | 1 |
| 1 | 1 | 1 | 7 | 6 | 5 | 4 | 3 | 2 | 1 | 7 | 6 | 5 | 4 | 3 |

| SELECT REGISTER 460 | | | COUNTER LOAD VALUE | | | PE high | PE low | NE high | NE low |
|---|---|---|---|---|---|---|---|---|---|
| $S_2$ | $S_1$ | $S_0$ | $B_2$ | $B_1$ | $B_0$ | "1" | "0" | "1" | "0" |
| 0 | 0 | 0 | X | X | X | X | X | X | X |
| 0 | 0 | 1 | X | X | X | X | X | X | X |
| 0 | 1 | 0 | X | X | X | X | X | X | X |
| 0 | 1 | 1 | 0 | 1 | 1 | 1 | 2 | 2 | 3 |
| 1 | 0 | 0 | 0 | 1 | 0 | 1 | 2 | 1 | 1 |
| 1 | 0 | 1 | 1 | 0 | 1 | 1 | 2 | 3 | 4 |
| 1 | 1 | 0 | 0 | 1 | 1 | 1 | 2 | 1 | 2 |
| 1 | 1 | 1 | 1 | 1 | 1 | 1 | 2 | 4 | 6 |
(614 labels the right portion)
*FIG. 7*
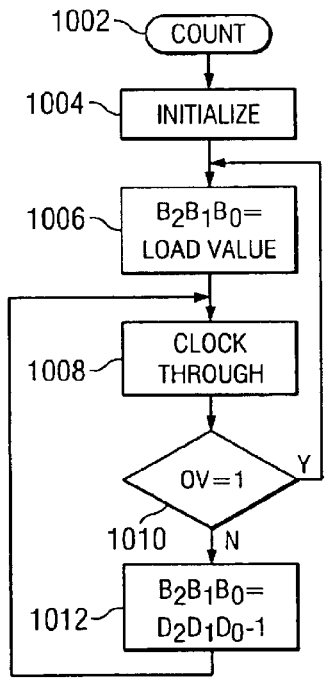
*FIG. 10*
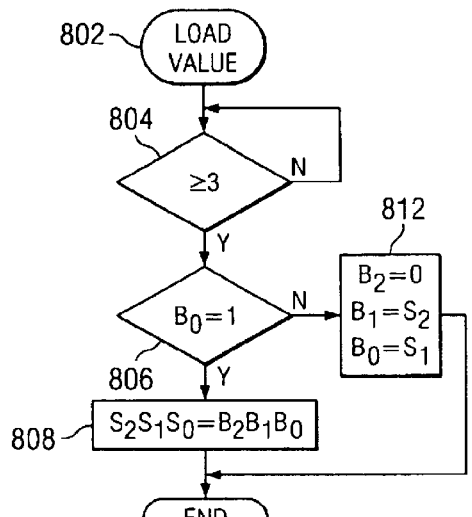
*FIG. 8*
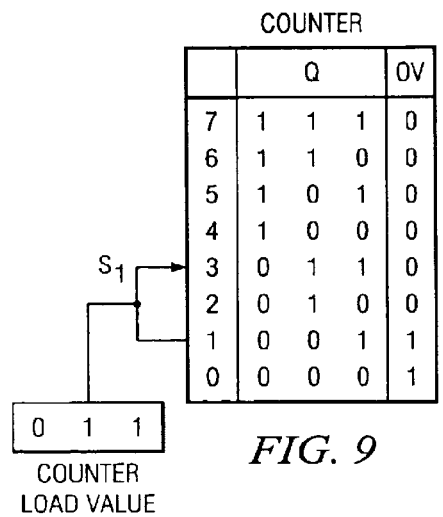
*FIG. 9*

CLOCK CIRCUIT WITH FRACTIONAL DIVIDE CIRCUIT

TECHNICAL FIELD OF THE INVENTION

The present invention pertains in general to clock circuits and, more particularly, to a clock circuit with a fractional divide functionality to provide an output clock that is divided by a non-integer value.

CROSS REFERENCE TO RELATED APPLICATIONS

N/A

BACKGROUND OF THE INVENTION

In order to achieve a relatively high frequency operation for an integrated circuit, there will be provided on that integrated circuit clock circuitry. This clock circuitry will operate at some base reference frequency that is typically defined by a crystal time base. However, to obtain higher operating speeds, higher clock frequencies are required than are provided with the base timing circuitry. To facilitate this, clock multipliers are utilized. For example, there are situations where certain circuitry on the integrated circuit is not capable of operating at the integer multiplication factor. This is due to the fact that there is some component on a functional block on the circuit that, due to processing limitations, etc., do not allow the overall integrated circuit to function at the highest clock operating speed, although the clock portion of the integrated circuit can operate at that frequency. However, there may be a maximum operating speed or frequency at which the functional circuitry will operate that is not an integer multiplication factor of the base timing of the clock. Rather than redesign the multiplier circuit, the full multiplication of the clock is performed and then a fractional divide is made to that maximized clock frequency. For example, if a base timing clock circuit operated on a crystal and provided a 25 MHz base clock, which was then multiplied to 100 MHz by a 4× multiplier, it may be that the functional circuitry or processing circuitry associated with the rest of the integrated circuit can only operate at ⅔ of the 100 MHz operating frequency or 66.67 MHz. Therefore, a fractional divide circuit of ⅔ would be required.

SUMMARY OF THE INVENTION

The present invention disclosed and claimed herein, in one aspect thereof, comprises a fractional divide circuit for generating a periodic fractional clock. A base clock is provided for generating a pre-divide clock at a base clock frequency with a period counter provided for counting cycles of the base clock. A select register stores constants that define parameters for a fractional divide ratio, there being at least four. A positive edge flip flop is provided wherein two of the constants are associated therewith. A negative edge flip flop is provided wherein the other of the two constants are associated therewith. A matching device is operable for setting on the positive edge of the base clock the first flip flop when the first of the two associated constants matches the output of the period counter and clearing the first flip flop when the other of the two associated constants matches the output of the period counter, and setting on the negative edge of the base clock the second flip flop when the first of the two associated constants matches the output of the period counter and clearing the second flip flop when the other of the two associated constants matches the output of the period counter. The outputs of the second and first flip flops are ANDed to provide the fractional clock output.

BRIEF DESCRIPTION OF THE DRAWINGS

For a more complete understanding of the present invention and the advantages thereof, reference is now made to the following description taken in conjunction with the accompanying Drawings in which:

FIG. 7 illustrates a table depicting the state machine operation for determining load values for the period counter and the relationship to the positive edge and negative edge table;

FIG. 8 illustrates a flow chart for the operation of determining the load value from the value in the select register;

FIG. 9 illustrates a table for the counter values;

FIG. 10 illustrates a flow chart for the operation of the period counter;

DETAILED DESCRIPTION OF THE INVENTION

Figures 1, 11:
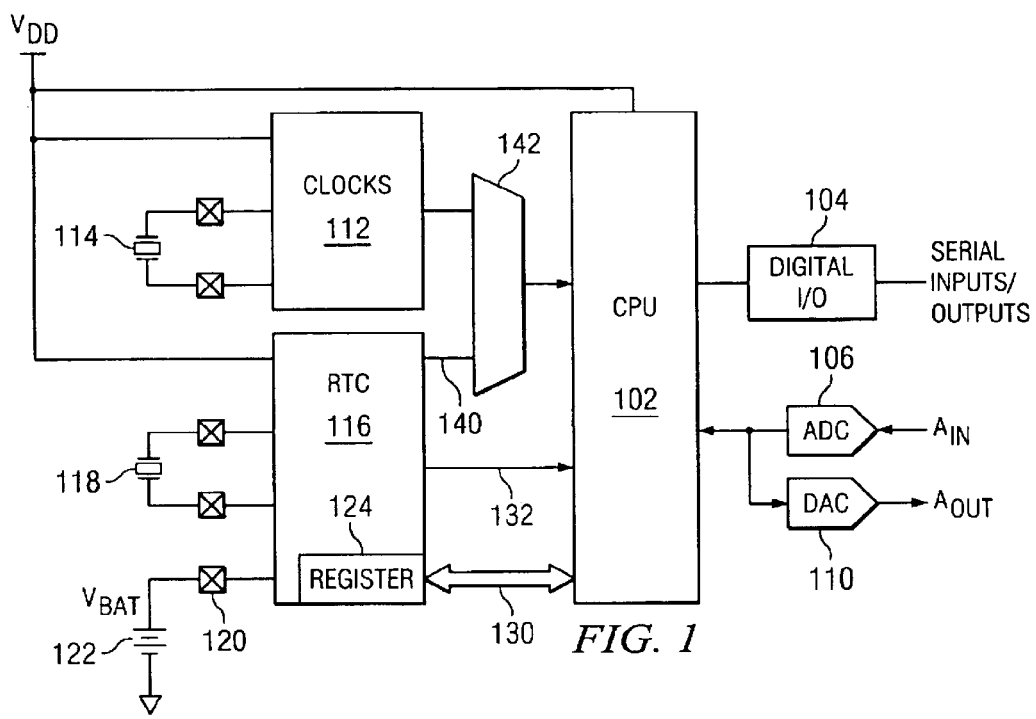
FIG. 1 illustrates an overall diagram view of an MCU with a separate low power real time clock (RTC)
FIG. 11 illustrates a table depicting the sequence of the counter as a function of the value in the select register.

Referring now to FIG. 1, there is illustrated a block diagram of a processor-based system that drives the mixed signal technologies that include as a part thereof, a digital section including a central processing unit (CPU) 102 and a digital I/O section 104 that is operable to interface with various serial inputs and outputs. The system also includes the analog section which provides for an analog-to-digital converter (ADC) 106 that is operable to receive one or more analog inputs and also provides a digital-to-analog converter 110 for allowing digital information from the CPU 102 to be converted to analog output information. The operation of the CPU 102 is controlled by various clocks 112 in a primary oscillator section. These are the operational clocks that control the overall operation of the MCU. In one mode, they will be interfaced with a crystal 114 for precision operation thereof. However, as will be described herein below, a precision internal non-crystal based clock can be utilized and, further, there can be a high frequency crystal and a low frequency crystal for two different operational modes. Normally, the output of the block 112 provides the operating clock with the CPU 102.

There is also provided a separate stand alone real time clock (RTC) block 116. This clock 116 operates on a separate RTC crystal 118 that provides the time base therefor. The RTC 116 interfaces with the chip supply voltage $V_{DD}$, which also drives CPU 102 and the clock block 112. The RTC block 116 interfaces with a battery terminal 120 and an external back-up battery 122. The RTC 116 has disposed thereon a plurality of registers 124, which are operable to store the timing information associated with the RTC 116. The RTC 116 operates independently with the primary purpose being to maintain current time and date information therein separate and independent of the operation of the digital and analog sections and the power required thereby or provided thereto. This information can be initialized by the CPU 102 through a digital interface 130 with the registers 124. During operation, the RTC 116 will update its internal time and date information, which information is stored in the registers 124. The RTC 116 is operable to generate an interrupt on an interrupt line 132 (to the CPU 102). Therefore, the RTC 116 can interface with the CPU 102 in order to generate an interrupt thereto. As will be described herein below, this interrupt facilitates waking the CPU 102 up when it is placed into an inactive or deep sleep mode. However, the CPU 102 at any time can query the register 124 for information stored therein. The RTC 116, as will also be described herein below, is a very low power circuit that draws very little current, the current on the order of 600 nA.

Figure 2:
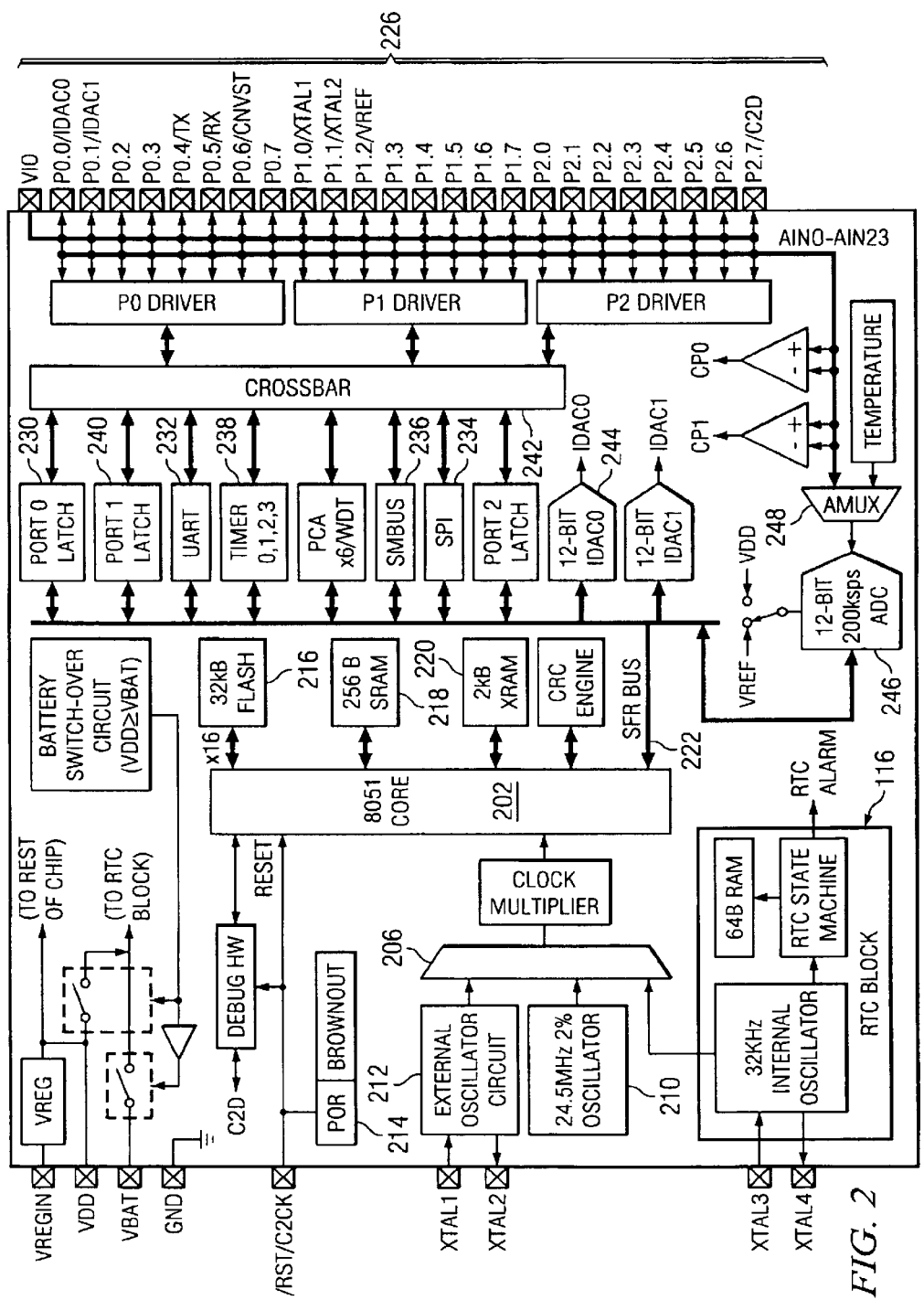
FIG. 2 illustrates an overall block diagram of the MCU chip showing the various functional blocks thereof.

Referring now to FIG. 2, there is illustrated a block diagram of the MCU 102. As noted herein above, this is a conventional operation of, for example, a part number C8051F330/1 manufactured by Silicon Laboratories Inc. The MCU 102 includes in the center thereof a processing core 202 which is typically comprised of a conventional microprocessor of the type "8051." The processing core 402 receives a clock signal on a line 204 from a multiplexer 206. The multiplexer 206 is operable to select among multiple clocks. There is provided an 80 kHz internal oscillator 208, a 24.5 MHz trimmable internal precision oscillator 212 or an external crystal controlled oscillator 210. The precision internal oscillator 212 is described in U.S. patent application Ser. No. 10/244,344, entitled "PRECISION OSCILLATOR FOR AN ASYNCHRONOUS TRANSMISSION SYSTEM," filed Sep. 16, 2002, which is incorporated herein by reference. The processing core 202 is also operable to receive an external reset on terminal 213 or is operable to receive the reset signal from a power-on-reset block 214, all of which provide a reset to processing core 202. This will comprise one of the trigger operations. The processing core 202 has associated therewith a plurality of memory resources, those being either flash memory 216, SRAM memory 218 or random access memory 220. The processing core 202 interfaces with various digital circuitry through an on-board digital bus 222 which allows the processing core 202 to interface with various operating pins 226 that can interface external to the chip to receive digital values, output digital values, receive analog values or output analog values. Various digital I/O circuitry are provided, these being latch circuitry 230, serial port interface circuitry, such as a UART 232, an SPI circuit 234 or an SMBus interface circuit 236. Three timers 238 are provided in addition to another latch circuit 240. All of this circuitry 230–240 is interfacable to the output pins 226 through a crossbar device 242, which is operable to configurably interface these devices with select ones of the outputs. The digital input/outputs can also be interfaced to a digital-to-analog converter 244 for allowing a digital output to be converted to an analog output, or to the digital output of an analog-to-digital converter 246 that receives analog input signals from an analog multiplexer 248 interfaced to a plurality of the input pins on the integrated circuit. The analog multiplexer 248 allows for multiple outputs to be sensed through the pins 226 such that the ADC can be interfaced to various sensors. Again, the MCU 102 is a conventional circuit.

Figure 3:
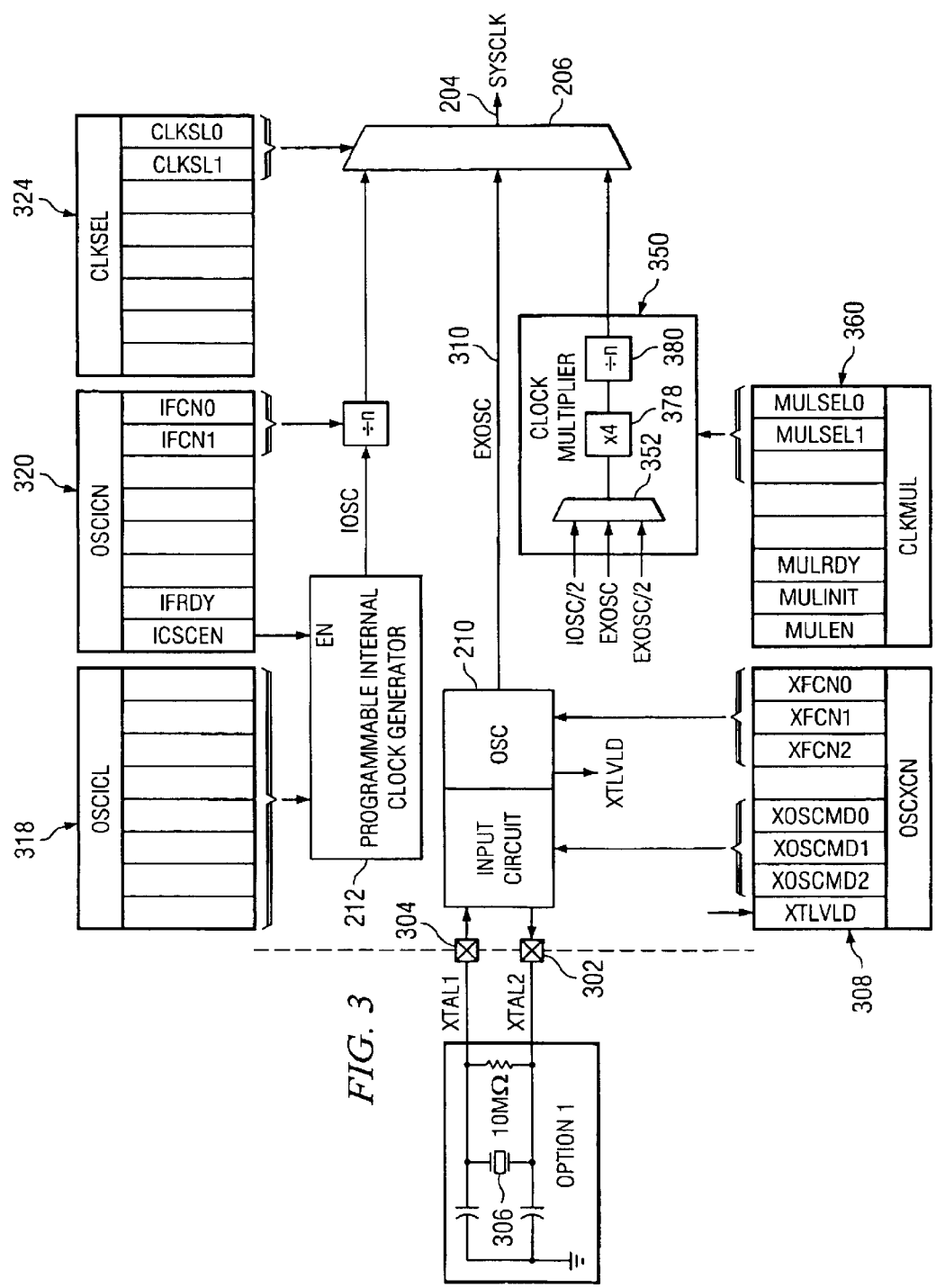
FIG. 3 illustrates a block diagram of the oscillators utilized for the processing operation of the MCU.

Referring now to FIG. 3, there is illustrated a schematic diagram of the primary oscillator section comprised of the oscillators 210 and 212 and the multiplexer 206. The oscillator 210 is a crystal controlled oscillator that is interfaced through two external terminals 302 and 304 to an external crystal 306 and operates up to frequencies in excess of 25 MHz. A register 308 is provided, labeled OSCXCN, which is operable to drive control signals for the oscillator 210 and to record output values thereof. The output of the oscillator 210 is provided on a line 310 to one input of the multiplexer 206 (equivalent to multiplexer 142 in FIG. 1). The programmable precision trimmable oscillator 212 is controlled by a register 318 and a register 320 to control the operation thereof, i.e., to both set the frequency thereof and to enable this oscillator. The output of the oscillator 212 is processed through a divide circuit 330, the divide ratio thereof set by bits in the register 320 to provide on an output 322 a precision high frequency clock to another input of the multiplexer 206. The output of the multiplexer 206 is provided to the MCU 102 on the clock line 404 as a system clock signal SYSCLK. The clock select operation is facilitated with a register 324 labeled CLKSEL, which controls the multiplexer 206.

The programmable high frequency oscillator 212 is the default clock for system operation after a system reset. The values in the register 318, labeled OSCICL, provide bits that are typically programmed at the factory, these bits stored in the flash memory. The center frequency of the high frequency clock is 24.5 MHz. The divide circuit 330 can provide a divide ratio of one, two, four or eight. The oscillator 212, in the C8051F330 device by way of example only, is a ±2 percent accuracy oscillator which has a center frequency that, although programmed at the factory, is allowed to be adjusted by changing the bits in the register 318. There are provided seven bits in the register 318 that are calibratable bits. The register 320 provides an enable bit for the oscillator 212 and a bit that determines if the oscillator 212 is running at the programmed frequency. Two bits in the register 320 are utilized to set the divide ratio of the divider 330.

There is also provided a clock multiplier circuit 350, which is comprised of a multiplexer 352 for selecting the output of the clock circuits 210, the internal clock 212 or the clock 210 divided by a factor of 2 and providing the selected clock to a 4× multiplier 378. This multiplied clock is then input to a fractional divide block 380, the output thereof selected by the multiplexer 206. This block 350 is controlled by a select register 360. The select register operates in accordance with the following table:

TABLE 1

| CLKMUL: Clock Multiplier Control Register | | | | | | | |
|---|---|---|---|---|---|---|---|
| R/W | R/W | R | R/W | R/W | R/W | R/W | R/W |
| MULEN | MULINIT | MULRDY | | MULDIV | | MULSEL | |
| Bit7 | Bit6 | Bit5 | Bit4 | Bit3 | Bit2 | Bit1 | Bit0 |

Bit7: MULEN: Clock Multiplier Enable
  0: Clock Multiplier disabled.
  1: Clock Multiplier enabled.
Bit6: MULINIT: Clock Multiplier Initialize
  This bit should be a '0' when the Clock Multiplier is enabled. Once enabled, writing a '1' to this bit will initialize the Clock Multiplier. The MULRDY bit reads '1' when the Clock Multiplier is stabilized.
Bit5: MULRDY: Clock Multiplier Ready
  This read-only bit indicates the status of the Clock Multiplier.

0: Clock Multiplier not ready.
1: Clock Multiplier ready (locked).
Bits4–2: MULDIV: Clock Multiplier Output Scaling Factor
These bits scale the Clock Multiplier output.
000: Clock Multiplier Output scaled by a factor of 1.
001: Clock Multiplier Output scaled by a factor of 1.
010: Clock Multiplier Output scaled by a factor of 1.
011: Clock Multiplier Output scaled by a factor of ⅔.
100: Clock Multiplier Output scaled by a factor of 2/4 (or ½).
101: Clock Multiplier Output scaled by a factor of ⅖.
110: Clock Multiplier Output scaled by a factor of 2/6 (or ⅓).
111: Clock Multiplier Output scaled by a factor of 2/7.
Bits1–0: MULSEL: Clock Multiplier Input Select
These bits select the clock supplied to the Clock Multiplier.

| MULSEL | Selected Input Clock | Clock Multiplier Output for MULDIV = 000b |
|---|---|---|
| 0 | Internal Oscillator/2 | Internal Oscillator × 2 |
| 1 | External Oscillator | External Oscillator × 4 |
| 10 | External Oscillator/2 | External Oscillator × 2 |
| 11 | Internal Oscillator | Internal Oscillator × 4 |

It can be seen that bits 4–2 set the divide ratio for the fractional divide circuit. For values "000," "001" and "010," there will be no fractional divide. For the remaining values, there will be a non integer divide.

Figure 4:
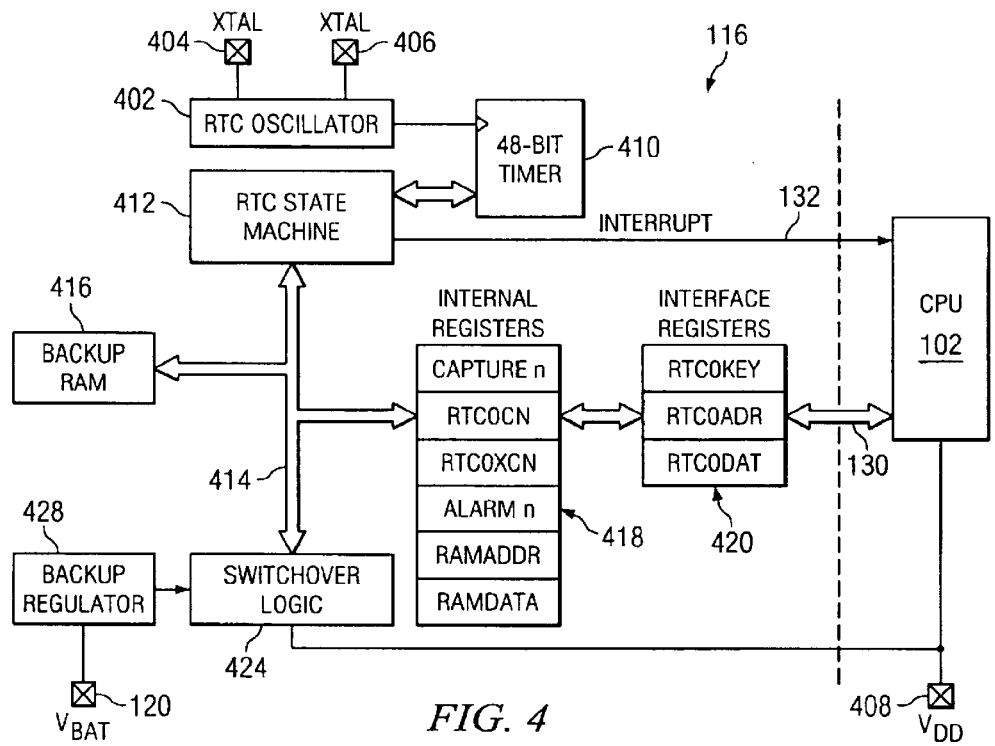
FIG. 4 illustrates a block diagram of the RTC.

Referring now to FIG. 4, there is illustrated a detailed block diagram of the low power RTC 116. There is provided a dedicated RTC oscillator 402 that is operable at 32 kHz oscillator frequency, which can be utilized with or without a crystal. There are provided two external pads 404 and 406 for interfacing with the crystal in a crystal-based mode or they can be connected together in a non-crystal based mode. Then the RTC 116 receives the back-up battery input on the node 120 and supply voltage $V_{DD}$ on a $V_{DD}$ pin 408. A 48-bit timer 410 is provided which is clocked by the RTC oscillator 402. An RTC state machine 412 controls the operation of the RTC 116 and is operable to interface with the 48-bit timer 410 to write data therein or read data therefrom and in general control the configuration thereof. As will be described herein below, the 48-bit timer includes a counter, latches and an alarm function. The RTC state machine 412 is operable to generate the interrupt on the line 132, when necessary, and is interfaced with an RTC internal bus 414. The internal bus 414 is operable to interface with a back-up RAM 416, which is typically configured with static RAM (SRAM) with a storage capacity of 64 bytes. Storage is provided by internal registers 418 which provide an internal storage for the data captured from the 48-bit timer 410 and various addressing data that is transferred between the RTC state machine 412 and the CPU 102. There is provided an interface register 420 that allows the CPU 102 an interface path to the internal registers 418. There is provided power control with a switch over logic block 424, which is operable to monitor the voltage level of $V_{DD}$ and, if it falls below a predetermined level, it will switch over to a back-up battery on the input terminal 120 (noting that the voltage $V_{DD}$ can be provided by a primary battery). There is provided a regulator circuit 428 that regulates the bach-up battery or the supply voltage to the appropriate level, if necessary.

When utilized with a crystal, operating at a frequency of 32.768 kHz watch crystal and a back-up power supply of at least 1V, the RTC 116 allows a maximum of 437 years of time keeping capability with 47-bit operation or 272 years with 48-bit resolution. This is independent of the operation of the overall MCU. Although not shown, the RTC state machine 412 also includes a missing clock detector that can interrupt the processor and the oscillators 118 from the suspend mode, or even generate a device reset when the alarm reaches a predetermined value.

The interface registers 420 include three registers, RTC0KEY, RTC0ADR, and RTC0DAT. These interface registers occupy a portion of the special function register (SFR) memory map of the CPU 102 and provide access to the internal registers 418 of the RTC 116. The operation of these internal registers is listed in the following Table 2. The RTC internal registers 418 can only be accessed indirectly through the interface registers 420.

TABLE 2

RTC0 Internal Registers

| RTC Address | RTC Register | Register Name | Description |
|---|---|---|---|
| 0x00–0x05 | CAPTUREn | RTC Capture Registers | Six Registers used for setting the 48-bit RTC timer or reading is current value. |
| 0x06 | RTC0CN | RTC Control Register | Controls the operation of the RTC State Machine. |
| 0x07 | RTC0XCN | RTC Oscillator Control Register | Controls the operation of the RTC Oscillator. |
| 0x08–0x0D | ALARMn | RTC Alarm Registers | Six registers used to set the 48-bit RTC alarm value. |
| 0x0E | RAMADDR | RTC Backup RAM Indirect Address Register | Used as an index to the 64 byte RTC backup RAM. |
| 0x0F | RAMDATA | RTC Backup RAM Indirect Data Register | Used to read or write the byte pointed to by RAMADDR. |

The RTC interface register RTC0KEY is a lock and key register that is operable to protect the interface 420. This register must be written with the correct key codes, in sequence, by the CPU 102 before Writes and Reads to the internal address register RTC0ADR and the internal data register RTC0DAT of the internal registers 418. This provides an address for the internal back-up RAM and data for being stored thereat for a Write and provides an address for a Read with a subsequent Write to the RTC0DAT register by the RTC 116 followed by a subsequent Read of that RTC0DAT register by the CPU 102. The key codes are 0xa5, 0xf1. There are no timing restrictions, but the key codes must be written in order. If the key codes are written out of order, the wrong codes are written, or an invalid Read or Write is attempted, further Writes and Reads to RTC0ADR and RTC0DAT will be disabled until the next system reset. Reading of the RTC0KEY register at any time will provide to the interface status of the RTC 116, but does not interfere with the sequence that is being written. The RTC0KEY register is an 8-bit register that provides four status conditions. The first is a block status, indicating that the two key codes must be sequentially written thereto. After the first key code is written, the status will change to the next status indicating that it is still locked, but that the first key code has been written and is waiting for the second key. The next status is wherein the interface is unlocked, since the first and second key codes have been written in sequence. The fourth status indicates that the interface is disabled until the next system reset. The RTC0KEY register is located at the SFR address 0xAE and, when writing thereto, the first key code 0xA5 is written followed by the second key code 0xF1, which unlocks the RTC interface. When the state indicates that it is unlocked, then any Write to the RTC0KEY register will lock the RTC0 interface.

The RTC internal registers 418 can be read and written using the RTC0ADR and RTC0DAT interface registers. The RTC0ADR register selects the particular RTC internal register that will be targeted by subsequent Reads/Writes to RTC0DAT. Prior to each Read or Write, the RTC interface Busy bit, bit 7 therein, should be checked to make sure the RTC interface is not busy performing another Read or Write operation. An example of an RTC Write to an internal register would involve a Wait operation when the Busy bit indicates it is busy. Thereafter, the RTC0ADR bit would be written with the value of, for example, 0x06, which would correspond to an internal RTC address of 0x06. This will be followed by a Write of a value of, for example, 0x00 to RTC0DAT which will Write the value 0x00 to the RTC0CN internal register (associated with the internal 0x06 address), which RTC0CN register is the RTC control register. There are generally in this embodiment, sixteen 8-bit internal registers. There are six internal registers for the captured data from the timer 410, one register for the RTC0CN control information, six alarm registers, and a back-up RAM address register and a back-up RAM data register. By first writing the control information to RTC0CN, this can be followed by writing or reading data from any of the other internal registers. To write to the register, the RTC0CN internal register has the Busy bit written thereto in order to initiate an indirect Read by the CPU 102. Once the Read is performed by the CPU 102, then the contents of RTC0DAT are loaded with the contents of RTC0CN. The system can be set such that there will be a sequence of indirect Reads by setting the appropriate bit in the control register. These will be provided with a series of consecutive Reads such that, for example, the contents of either the capture registers or the alarm registers can be completely read out. The RTC0ADR register will automatically increment after each Read or Write to a capture or alarm register. The RTC0CN register is an 8-bit register and has an enable bit, a missing clock detector enable bit, a clock fail flag bit, a timer run control bit indicating that the timer either holds its current value or increments every RTC clock period, an alarm enable bit that is operable to enable the alarm function, a set bit that causes the value in the timer registers, the capture registers, to be transferred to the RTC timer for initialization purposes and the capture bit that causes the contents of the 48-bit RTC timer to be transferred to the capture registers. There is also provided an oscillator control register, RTC0XCN, which is an 8-bit register providing for gain control of the crystal oscillator, a mode select bit for selecting whether the RTC will be used with or without a crystal, a bias control bit that will enable current doubling, a clock valid bit that indicates when the crystal oscillator is nearly stable and a $V_{BAT}$ indicator bit. When this is set, it indicates that the RTC is powered from the battery.

The RTC timer 410 is, as described herein above, a 48-bit counter that is incremented every RTC clock, when enabled for that mode. The timer has an alarm function associated therewith that can be set to generate an interrupt, reset the entire chip, or release the internal oscillator in block 112 from a suspend mode at a specific time. The internal value of the 48-bit timer can be preset by storing a set time and date value in the capture internal registers and then transferring this information to the timer 410. The alarm function compares the 48-bit value in the timer on a real time basis to the value in the internal alarm registers. An alarm event will be triggered if the two values match. If the RTC interrupt is enabled, the CPU 102 will vector to the interrupt service routine when an alarm event occurs. If the RTC operation is enabled as a reset source, the MCU will be reset when an alarm event occurs. Also, the internal oscillator 112 will be awakened from suspend mode, if in that mode, on an RTC alarm event.

Figure 5:
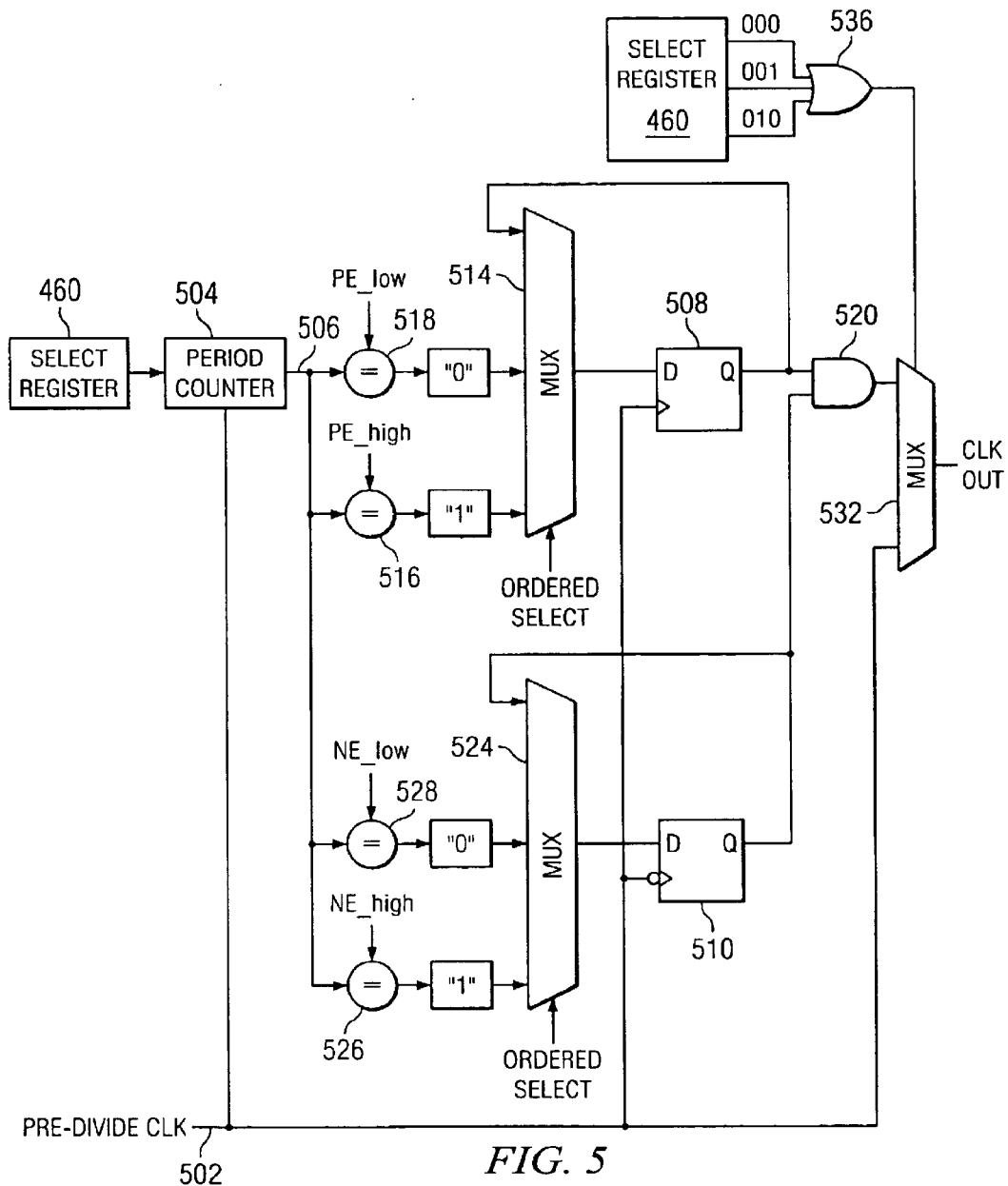
FIG. 5 illustrates a logic diagram for the overall fractional clock circuit.

Referring now to FIG. 5, there is illustrated a logic block diagram of the fractional divide circuit 380, which is clocked by the pre-divide clock circuit. If the multiplier 378 was a 4× counter with a 25 MHz clock, then the pre-divide clock would have a frequency of 100 MHz. This is input on a node 502. The select register 360 is operable to provide a 3-bit output value from "000" through "111." As noted herein above, the first three values, "000," "001" and "010" will select the pre-divide clock and the others will select fractional divide clocks. The select register output is utilized for the values of "011" and above to drive a period counter 504. This will provide a count output on a line 506. The period counter 504 is a state counter, wherein the load value of a counter is dependent upon the last state, on the output thereof. This will be described in more detail herein below. There are provided four constants, two for setting a positive edge flip-flop 508 and two for setting a negative edge flip-flop 510. The two constants that are associated with the positive edge flip-flop 508 are the PE_LOW and PE_HIGH.

Each of the flip-flops 508 and 510 are clocked by the high frequency pre-divide clock on line 502, it being noted that the flip-flop 510 is clocked with the inverted pre-divide clock. In order to determine what the data state is on the input to the flip-flop 508, a state machine determines what the level of the clock is, i.e., "high" or "low," the state of the clock relative to the two constants PE_LOW and PE_HIGH. For this portion of the state machine, the flip-flop 508 has a data input thereof connected to the output of an ordered multiplexer 514. The multiplexer 514 has three inputs. The state machine operates such that the decision made with respect to the first input, if it is true, results in selection of that fixed input, a "1," for output therefrom. If false, then the decision associated with the second input is assessed and, if true, then that fixed input, a "0," is output as the input to the flip-flop 508. If neither of the decisions for the first and second input is true, then the third input is connected to the Q-output of the flip-flop 508. The first decision is a decision wherein the value of PE_HIGH associated with the particular 3-bit output of the select register 360 is compared to the count value of the period counter. Each of the potential 3-bit values above "010" stored in the select register 360 has associated therewith fixed values for PE_LOW, PE_HIGH, NE_LOW and NE_HIGH. If the corresponding value of PE_HIGH is determined to be equal to the output of the counter with an equality block 516, then a "1" is input to the first input of multiplexer 514, i.e., the highest priority one thereof. If the equality is not true, then the select input multiplexer 514 will evaluate the decision associated with the next input. The decision associated with the next input, the next priority input, will have a decision made as to whether the output of the counter 504 on line 506 is equal to the fixed value of PE_LOW associated with the of the select register 360, decided in an equality block 518. If so, a "0" is selected by the multiplexer 514 for output to the data input of the flip-flop 508. If this is a false decision, then the output of the multiplexer 514 is connected to the output of the flip-flop 508. Therefore, the multiplexer 514 will either force a "1" to the data input of the flip-flop 508, a "0" or the last state, depending upon the comparison of the output value of the counter 504 with either PE_HIGH or PE_LOW. The Q-output of the flip-flop 508 is input to one input of an AND gate 520.

The decisions made with respect to flip-flop 51 are similar to that associated with flip-flop block 508. In this block, there is provided a multiplexer 524 that provides data to the data-input of the flip-flop 510. The first input is associated with a decision wherein the constant NE_HIGH is compared with the output of a counter 504 and, if it is determined to be equal by an equality block 526, then a "1" is output from the multiplexer 524. If this is determined to be false, then the decision associated with the next input is determined. This is a decision wherein the fixed value of NE_LOW associated with the output of the select register 360 is compared to the output of the counter 504 with an equality block 528 and, if true, then a "0" on the second input of multiplexer 524 is connected to the output thereof. If neither decision associated with the equality block 526 or 528 were true, then the third input of the multiplexer 524 is connected to the Q-output of the flip-flop 510 such that the last state is forced as an input thereto. The Q-output of the flip-flop 510 is input to the other input of the AND gate 520. The output of the AND gate 520 is input to one input of the multiplexer 532, which is operable to select either the output of the AND gate 520, this being the fractional divide clock, or select the pre-divide clock on the node 502. The output of multiplexer 532 provides the clock output. The multiplexer 532 is operable to select the node 502 whenever the output of the select register 360 is either "000," "001" or "010." These three inputs are input to a 3-input OR gate 536, the output thereof providing the select input to multiplexer 532.

Figure 6:
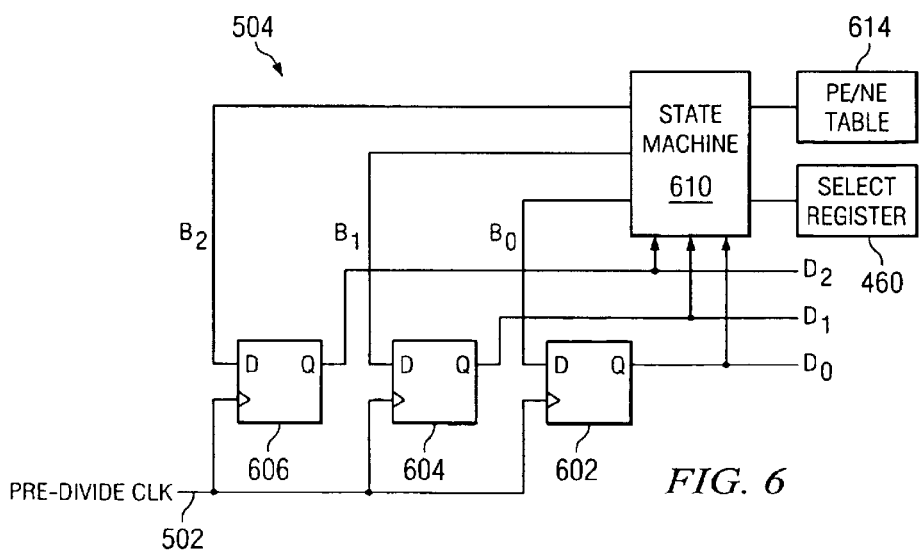
FIG. 6 illustrates a logic diagram for the period counter.

Referring now to FIG. 6, there is illustrated a block diagram of the period counter 504. The period counter 504 is a 3-bit counter that is comprised of a 3-bit state counter which has associated therewith three flip-flops 602, 604 and 606 associated with the data output values, $D_0$, $D_1$ and $D_2$, respectively. These are provided on the Q-outputs thereof. The data inputs thereto are connected to the data input bits $B_0$, $B_1$ and $B_2$, respectively. The clock inputs of the flip-flops 602–606 are connected to the pre-divide clock on the line 502.

The flip-flops 602–604 have the input state thereof determined by a state machine 610, which is operable to perform a lookup and determine the data input value for the bits $B_0$, $B_1$ and $B_2$. This is either a predetermined state obtained from a lookup table or the last state thereof either decremented or incremented. The state machine 610, as will be described herein below, has access to the contents of the select register 360 and also to a PE/NE table 614.

Referring now to FIG. 7, there is illustrated a table depicting the relationship between the value in the select register 360, the initial counter load value and the PE/NE table 614. The state machine 610 operates a counter by determining what the value in the select register 360 is and then determining what the initial load value is in order to determine the counter sequence. As noted herein above, for values in the select register 360 between 0–2, the period counter will not be required, since the output of the pre-divide clock is selected. However, once the value is equal to a value from 3–7, then the fractional divide will operate. There are provided two columns, one for the select register 360 output and one for the counter load value for the bits $B_0$, $B_1$ and $B_2$. In general, the counter load value is determined by examining the value of $S_0$ in the select register 360 and then, if it is a "1," outputting the value of the select register as the values of $B_0$, $B_1$ and $B_2$, i.e., a direct correspondence therewith, or, if the value is a "0," then shifting to the right by substituting $B_0$ with the $S_1$ value, $B_1$ with the $S_2$ value and $B_2$ with "0."

The illustration of determining the counter load value is set forth in the flow chart of FIG. 8. This is initiated at a block 802 and then flows to a decision block 804 to determine if the value of the select register is greater than or equal to "3." If so, the program flows along the "Y" path to a decision block 806 to determine if the value of $B_0$ is equal to 1. If so, the program flows along the "Y" path to a function block 808 to set the load value equal to that in the select register 360 and then proceeds to an End block 810. If the value of $B_0$ was determined not to be equal to "1" in the decision block 806, the program flows along the "N" path to a function block 812 to make the substitution of $B_0$ to $S_1$, $B_1$ to $S_2$ and $B_2$ to "0." The program then flows to the End block 810.

Referring now to FIG. 9, the operation of the counter will be described. In general, the state machine 610 operates the counter as a decrementing counter. The initial load value, as determined by the flow chart of FIG. 8 will be loaded in to the counter. There will also be an overflow value, "OV," that is associated with each value of the counter. The value of OV for count values of "2" through "7" will be set to "0." For the value of "0" or "1" of the counter output, the overflow value is set to "1." Once the counter is initialized at the load value, the counter will decrement until it is determined that the current state has an overflow value of "1" which will then result in the next value being the counter load value. In this embodiment, for a select register output of "011" associated with the value "3," there will be a counter load value of "011." This will result in the value of "011" being the initial value of the counter and then it will decrement to "010" with an overflow value of "0," which will then result in the counter being further decremented to the value of "001." The overflow value for "01" is "1," such that the next state will be the counter load value of "011." Thus, the counter will sequence from 3, 2, 1 over to 3, 2, 1, and so on. This, of course, is dependent upon the counter load value as set forth herein above with respect to the table in FIG. 7.

Referring now to FIG. 10, there is illustrated a flow chart depicting the operation of the period counter 504. This is initiated at a block 1002 and then proceeds to a block 1004 to initialize the counter with a load to value. The initial value will be the load value form the table of FIG. 7 that his determined by the flow chart of FIG. 8. This will be loaded as a load value in function block 1006. The program then flows to a function block 1008 to clock this through to the output and then proceeds to a decision block 1010 to determine if the overflow value of the current state is "1." If so, this indicates the end of the count and the program flows along the "Y" path back to the input of the function block 1006 to again load the load value determined by the flow chart of FIG. 8. If the overflow value is not equal to "1," then the program proceeds along the "N" path to a function block 1012 in order to decrement the output value by "1" and then provide this as the load value, i.e., this is a decremented counter. The program then flows back to the input of function block 1008 to again clock through the value to continue the count.

Referring now to FIG. 11, there is illustrated a table depicting the counter sequence for a given value of the select register. As noted herein above, until the value equals "011" associated with the value of "3," there will be no sequencing of the counter. For the value of "011," the sequence will then be "321321. . ." for the remaining values of "4" through "7" there are illustrated the sequence of values that are output, each of these output values represented by a 3-bit count output. This is the output of the flip-flops 602, 604 and 606.

Figure 12:
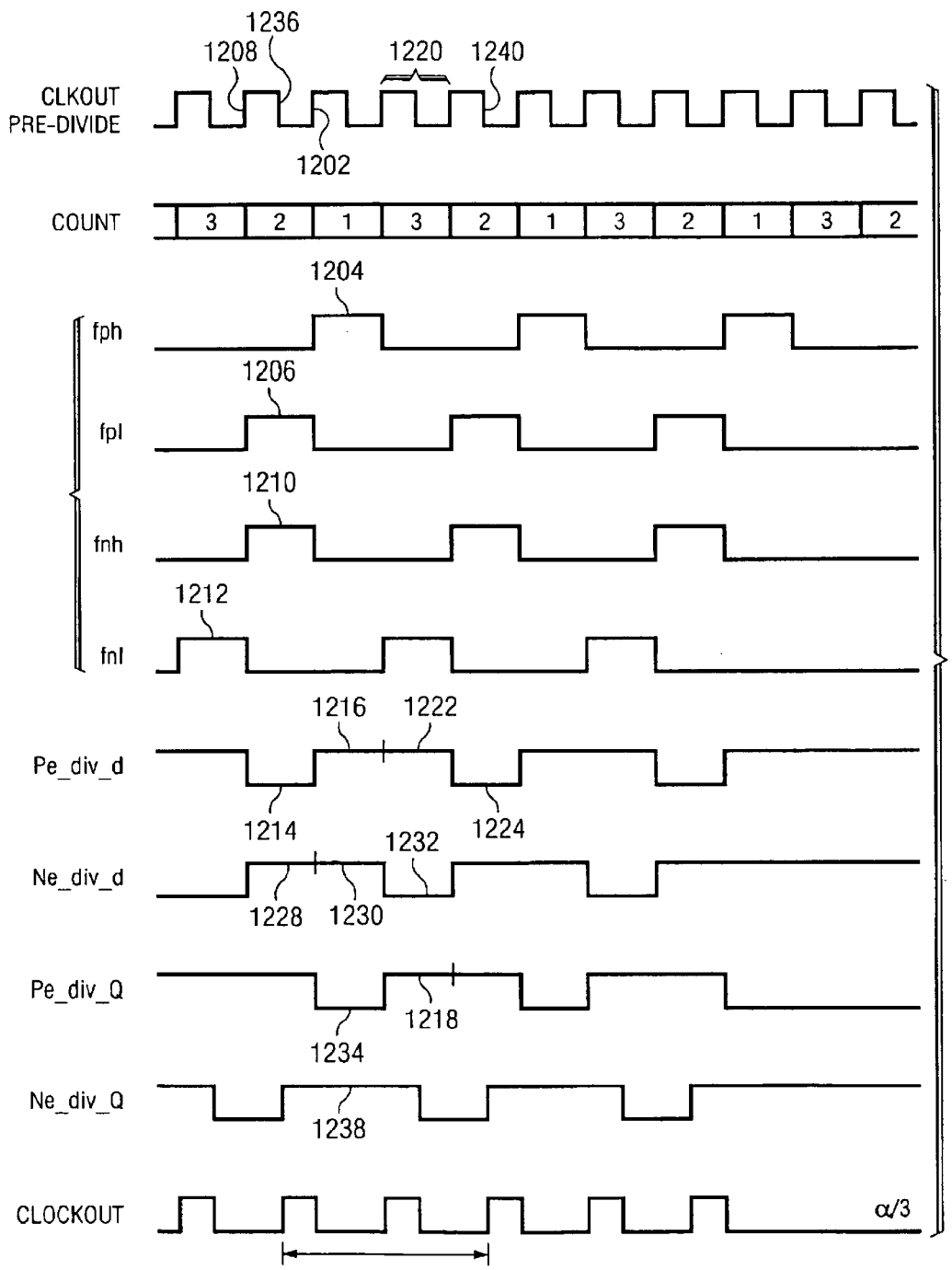
FIG. 12 illustrates a timing diagram for the operation of the clock logic diagram of FIG. 5.

Referring now to FIG. 12, there is illustrated a timing diagram depicting the operation of the embodiment of FIG. 5. The pre-divide clock which is labeled CLKOUT PREDIV is set forth and the example herein will be that for the select register value of "011" which will have a sequence of "321321321321. . ." To evaluate this, it can be seen from the table of FIG. 7 that PE_HIGH is a "1" and PE_LOW is a "2," NE_HIGH is a "2" and NE_LOW is a "3." These are fixed values, i.e., the "constants," for that select register value. For simplicity sake, there are provided four states for the results of the equality blocks 516, 518, 526 and 528, associated with the constants PE_HIGH, PE_LOW, NE_HIGH and NE_LOW respectively. These are labeled fph, fpl, fnh and fnl, respectively. For the equality block 516, the output will be true, i.e., "high," for the situation where the count value is equal to the value of PE_HIGH of"1." This will occur when the count value is equal to "1" and will be clocked by an edge 1202 of the high speed clock to provide a true result 1204 represented by a high state. The states for fph, fpl, fnh and fnl are a "0" for a false and a "1" for a true. Similarly, whenever the count value is "2," fpl will be a true 1206, indicated as occurring at edge 1208 of the high speed clock. The state of fnh will be a true 1210 at substantially the same time as fpl and fnl being a true 1212 whenever the count value is equal to "3." This is periodic and, each time the count value is, for example, a "1," then fph will be true, i.e., corresponding to the output of the equality block 516.

On the output of the multiplexers 514 and 524, there are provided a data input to the flip-flops 508 and 510, respectively. These are referred to as the data states PE_DIV_D for the data on the positive edge and NE_DIV_D for the data to the input of the flip-flop 510 for the negative edge. For the positive edge, the multiplexer 514 first examines the first input to determine if the equality is true. If not, it will go to the next one. For the first count "3" and for the second count "2," the decision is false and the second input will be evaluated. For the value of "3," the equality associated with equality of block 518 is false and, therefore, the value will be that of the previous state. However, for a count value of "2," the multiplexer 514 will select the "0" forced input for input to the input of the flip-flop 508, such that a "low" will occur at a state 1214. At the next clock, the counter output is a "1," which results in the output of the equality block 516 being true and forcing a "1" to the input of flip-flop 508, at a logic state 1216. On the next clock cycle, the counter value is a "3," resulting in the output of equality blocks 516 and 518 being false, such that the previous state is input to the data input flip-flop 508. This state 1216 is clocked through to the output thereof, represented as a state 1218. At the clock cycle 1220, the equality blocks 516 and 518 are false and the output of the flip-flop 508, being at a high state, will be loaded back into the multiplexer 514 to provide a state 1222. At the next clock cycle, the counter value is "2" and the equality block 518 will have a true output, forcing a "0" to the input of the flip-flop 508 to provide a state 1224.

The negative edge operation is also substantially the same. At the clock edge 1208, the counter is decremented to the value of "2" that will result in the equality block 526 outputting a true determination and this will result in a "1" being forced to the input of the flip-flop 510, as noted by a state 1228. When a "1" is provided form the output of the period counter at the next clock cycle at edge 1202, the output of both equality counters 526 and 528 will be false and the last state, the state 1228, will be output at a state 1230. At the next count value of "3" for the clock cycle 1220, the output of the equality counter 528 is true and that will result in a "0" being forced to the input of the flip-flop 510 at a state 1232.

The flip-flops 508 and 510 are clocked such that flip-flop 508 is clocked on the positive edge and flip-flop 510 is clocked on the negative edge. Therefore, the state of PE_DIV_D is clocked on the positive edge thereof and the state 1214 will be clocked through on the next rising edge 1202 to change the state to a state 1234 on the output of flip-flop 508. The state 1228 on NE_DIV_D will be transferred to the output of flip-flop 510 on a negative edge 1236 to be transferred to the state 1228 to the output thereof at a state 1238. Thereafter, the AND gate 520 will perform the AND function thereof to provide a clock output as set forth in the next diagram, this being a ⅔ clock in accordance with the operation thereof. It can be seen that over three clock periods from a negative edge 1236 to a negative edge 1240 of the master clock, there will be two clock cycles of the output clock. All of the tables and everything are designed to provide such.

Although the preferred embodiment has been described in detail, it should be understood that various changes, substitutions and alterations can be made therein without departing from the spirit and scope of the invention as defined by the appended claims.

What is claimed is:

1. A fractional divide circuit for generating a periodic fractional clock comprising:
    a base clock for generating a pre-divide clock at a base clock frequency;
    a period counter for counting cycles of said base clock;
    a select register for storing constants that define parameters for a fractional divide ratio, there being at least four;
    a positive edge flip flop and wherein two of said constants are associated therewith;
    a negative edge flip flop, and wherein the other of said two constants are associated therewith;
    a matching device for;
        setting on the positive edge of said base clock of said positive flip flop when the first of said two associated constants matches the output of said period counter and clearing the said positive flip flop when the other of said two associated constants matches the output of said period counter, and
    setting on the negative edge of said base clock of said negative flip flop when the first of said two associated constants matches the output of said period counter and clearing said negative flip flop when the other of said two associated constants matches the outputs of said period counter; and
    ANDing the outputs of said negative and positive flip flops to provide the fractional clock output.

2. The divide circuit of claim 1, wherein said constants are stored in a table in said select register.

3. The divide circuit of claim 2, wherein said constants vary for each of a plurality of divide ratios.

4. The divide circuit of claim 3, wherein each of said associated constants for each of said divide ratios has associated therewith counter control parameters that define the operation of said period counter.

* * * * *